(12) United States Patent
Hesener

(10) Patent No.: US 7,468,688 B2
(45) Date of Patent: Dec. 23, 2008

(54) CONVERTER AND METHOD FOR CONVERTING AN ANALOG SIGNAL AND COMPARATOR FOR USE IN SUCH CONVERSION

(75) Inventor: Marc Hesener, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/516,398

(22) Filed: Sep. 6, 2006

(65) Prior Publication Data

US 2008/0055136 A1 Mar. 6, 2008

(51) Int. Cl.
*H03M 1/66* (2006.01)
(52) U.S. Cl. .................................. 341/144; 341/155
(58) Field of Classification Search ............. 341/155, 341/144, 161, 139; 330/253
See application file for complete search history.

(56) References Cited

U.S. PATENT DOCUMENTS

| 4,350,974 | A | * | 9/1982 | Gordon et al. | 341/138 |
| 5,055,847 | A | * | 10/1991 | Rybicki et al. | 341/162 |
| 5,276,685 | A | * | 1/1994 | Kepler et al. | 370/332 |
| 5,614,948 | A | * | 3/1997 | Hannah | 348/255 |
| 5,877,645 | A | * | 3/1999 | Comino et al. | 327/350 |
| 6,313,779 | B1 | * | 11/2001 | Leung et al. | 341/155 |
| 6,392,395 | B2 | * | 5/2002 | Roberts et al. | 324/66 |
| 6,553,242 | B1 | * | 4/2003 | Sarussi | 600/330 |
| 6,891,405 | B2 | | 5/2005 | Fujimora | 327/52 |
| 6,903,889 | B2 | * | 6/2005 | Li et al. | 360/31 |
| 6,917,323 | B2 | * | 7/2005 | Stevens et al. | 341/155 |
| 7,129,867 | B2 | * | 10/2006 | Kim et al. | 341/118 |
| 7,171,251 | B2 | * | 1/2007 | Sarussi et al. | 600/324 |
| 7,242,545 | B1 | * | 7/2007 | Cheng | 360/46 |
| 7,271,651 | B2 | * | 9/2007 | Chen et al. | 330/253 |

OTHER PUBLICATIONS

HSU and WU, A highly linear 125 Mhz CMOS switched-resistor programmable-gain amplifier, IEEE Journal of Solid-State Circuits, Oct. 2003, 1663-1669, vol. 38, No. 10, USA.

* cited by examiner

*Primary Examiner*—Peguy JeanPierre

(57) ABSTRACT

A converter comprises an input terminal to receive a first analog signal, a digital-to-analog converter to provide second analog signals related to digital values applied to the digital-to-analog converter. A comparator is coupled to receive the first and second analog signals, the comparator also comprising a variable-gain amplifier to provide an output signal based on a difference between the first and second analog signals. A state machine receives the output signal of the comparator and to generate the digital values applied to the digital-to-analog converter based on the output signal of the comparator and a controller sets the gain of the variable-gain amplifier selectively.

22 Claims, 8 Drawing Sheets

T= 2ns

CONVERTER AND METHOD FOR CONVERTING AN ANALOG SIGNAL AND COMPARATOR FOR USE IN SUCH CONVERSION

BACKGROUND

Converters for converting analog to digital signals (ADC) or digital to analog signals (DAC) are getting increasingly important in many applications. To name only a few, Music conservation and restoring and digital communication are fields wherein analog-to-digital converters are widely in use.

Many types of analog-to-digital converters exist in the field, among which are, to give only a few examples, successive approximation converters, sigma delta converters or Flash converters. Many of these analog-to-digital converters use comparators. For example, comparators can be found in analog-to-digital converters of the successive approximation type, wherein an analog signal is applied to a first input of a comparator and a second reference signal is applied by a digital-to-analog converter for each cycle of the-successive approximation to the second input of the comparator. In order to meet the increasingly high performance requirements and for other reasons, there is a need for an improved converter, an improved method for converting an analog signal and an improved comparator in a converter.

DETAILED DESCRIPTION OF THE INVENTION

The following detailed description explains exemplary embodiments of the present invention. The description is not to be taken in a limiting sense, but is made only for the purpose of illustrating the general principles of the embodiments of the invention. The scope of the invention, however, is only defined by the claims and is not intended to be limited by the exemplary embodiments described below.

Figure 1:
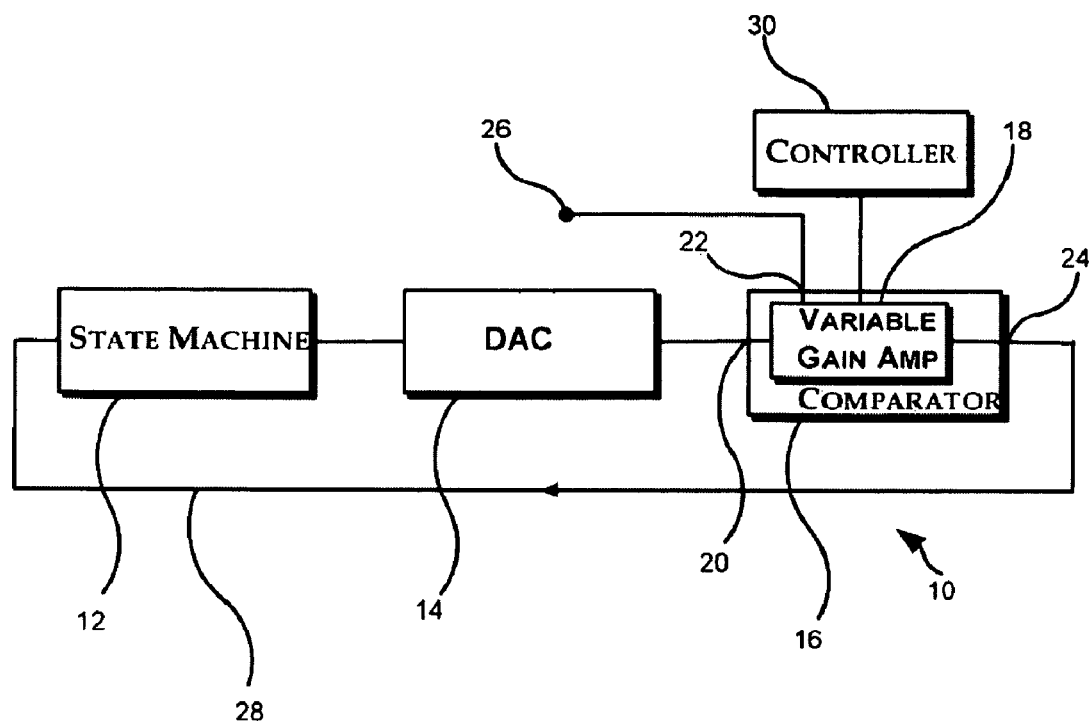
FIG. 1 shows a block diagram of a first embodiment of the present invention.

FIG. 1 shows a schematic drawing of an illustrative embodiment of the present invention. An analog-to-digital converter 10 of the successive approximation type comprises a state machine 12 having an output which is coupled to an input of a digital to analog converter 14. An output of the digital-to-analog converter 14 is coupled to an input of a comparator 16. The comparator 16 comprises a variable-gain amplifier 18 having a first input coupled to a first input 20 of the comparator 16 and a second input coupled to a second input 22 of the comparator 16. The output of the variable-gain amplifier 18 is coupled to an output 24 of the comparator 16. A terminal 26 for applying a first analog signal is connected to the second input 22 of the comparator 16. The output 24 is coupled via a feedback loop 28 to an input of the state machine 12. Furthermore, a controller 30 is connected to the variable-gain amplifier 18 for selectively setting the gain of the variable-gain amplifier 18 as will be described below.

Although the variable-gain amplifier 18 is shown in FIG. 1 as directly connected to the output 24 of the comparator 16, it is intended in other embodiments that the variable-gain amplifier 18 is indirectly connected to output 24. Furthermore, other embodiments encompass one or more additional elements such as a latch or filters arranged between the variable-gain amplifier 16 and the output 24.

In one embodiment of the present invention, the amplifier 18 is configured as a fully-differential amplifier. That is, the variable-gain amplifier 18 comprises a differential input, i.e. a couple of inputs and a differential output i.e. a couple of outputs. However, other embodiments encompass differential amplifiers having a differential input and a single-ended output. Thus, although the amplifier 18 is shown in FIG. 1 to be connected by a single line to output 24, it is intended to include single line connections as well as differential line connections. Furthermore, although the feedback loop 28 is shown as a single line connecting the output 24 of comparator 16 to the state machine 12 it is intended to include single line connection as well as differential line connection.

Figure 2:
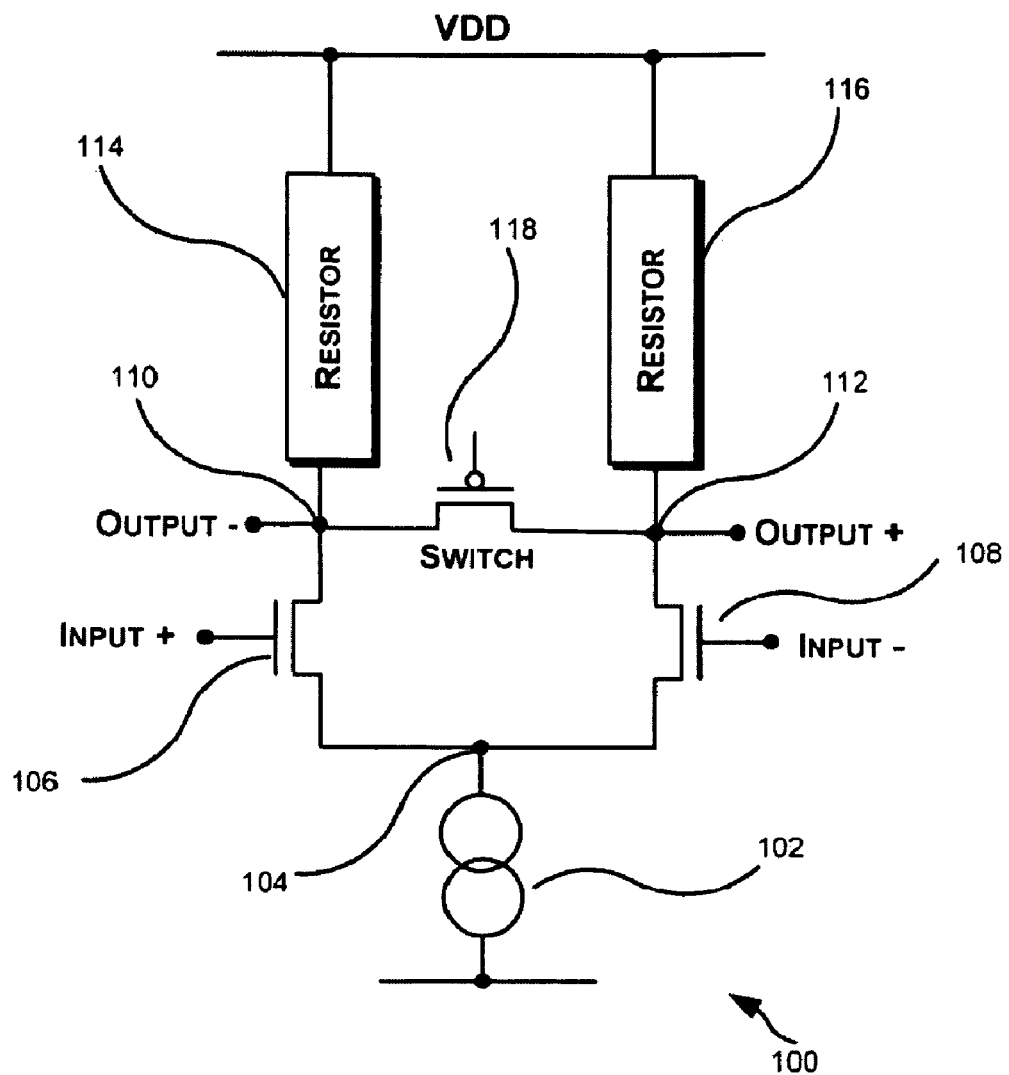
FIG. 2 shows an equivalent circuit of a differential amplifier according to one embodiment to the present invention.

An illustrative embodiment of a selectively adjustable differential amplifier 100 which can be used as variable gain amplifier in the comparator 16 is shown in FIG. 2. FIG. 2 shows the amplifier 100 comprising a current source 102 having a first output connected to a common potential, for example ground. A second output of the current source 102 is connected to a first node 104. A first transistor 106 and a second transistor 108 are coupled to the node 104. Each of the transistors 106 and 108 comprises a first and a second signal terminal as well as a gain control terminal for controlling the resistance of the transistor between the first and the second signal terminals.

In this embodiment, the transistor is an n-MOS-transistor and the control terminal is a gate of the MOS-transistors and the two signal terminals are the source and drain of the MOS-transistor. However, it is to be understood that one or both of transistors 106 and 108 can be replaced in other embodiments by other controllable 3-port elements, such as p-MOS-transistors, bipolar transistors of the pnp and npn type, power transistors, IGBTs (insulated gate bipolar transistors).

The control terminal of the first transistor 106 is coupled to a first input of the differential amplifier 100 and the control terminal of the second transistor 108 is coupled to a second input of the differential amplifier 100. The second signal terminal of the first transistor 106 is connected to a first node 110 and the second signal terminal of the second transistor 108 is connected to a second node 112.

The amplifier 100 comprises a first resistor 114 and a second resistor 116. The first resistor 114 is connected between the first node 110 and a power supply rail providing a common potential VDD. The second resistor 116 is connected between the second node 112 and the power supply rail. In other words, the resistors 114 and 116 are connected via the power supply rail.

In the described embodiment, the amplifier is configured as a fully differential amplifier. In the amplifier, the first transistor 106 and the first resistor 114 form a first branch of the differential amplifier 100 whereas the second transistor 108 and the second resistor 116 form a second branch of the differential amplifier 100.

A switch 118 is provided in the differential amplifier 100 for allowing switching of the gain of amplifier 100. The switch 118 comprises first and second signal terminals which are coupled to the first node 110 and the second node 112, respectively. In the embodiment shown in FIG. 2, switch 118 is formed by a MOS-transistor. The source of the MOS-transistor is connected to node 110 and the drain is connected to node 112. In the embodiment shown in FIG. 2, switch 118 formed by a MOS-transistor is symmetrical, i.e. source and drain are provided as interchangeable. However, in other embodiments the MOS-transistor can be non-symmetrical.

Furthermore, a control terminal of the switch 118 is coupled to a control input of the amplifier 100 for switching the gain of the amplifier. An output terminal of the amplifier 100 is connected to the second node 110 and a second output terminal of the amplifier 100 is coupled to the third node 112.

As can be seen from FIG. 2, the switch 118 is formed in this embodiment by a p-MOS transistor for varying the gain of the amplifier by switching the impedance between the second node 110 and the third node 112. In other words, the switch 118 formed by the single p-MOS transistor allows the switching of the output impedance by applying a control signal to the control terminal of switch 118 for switching from a high impedance state of the channel formed between the two signal terminals of the transistor in which the carriers are extracted from the channel to a low impedance state in which carriers are present in the channel. Thus, by applying a control signal to the control terminal of the switch 118, the impedance between two nodes 110 and 112 can be switched between the above two states. However, it is to be understood that the switch can be switched between more than two states-by applying a multi-level signal to the control terminal of the switch 118.

In the described embodiment, the output impedance of the amplifier is formed by first and second resistors 114 and 116 having a fixed value and the variable resistance between the two signal terminals of the switch 118 provided parallel to the first and second transistors. However, it is to be understood that, in one embodiment of the present invention, other switches can be provided for varying the output impedance including n-MOS-transistors or any type of bipolar transistors.

In an embodiment, the resistors 114 and 116 have a fixed resistance value R. However, the resistors 114 and 116 can be replaced in other embodiments by a variable resistor or a transistor wherein a resistance is kept constant for example by applying a predetermined constant control signal.

In operation, current source 102 generates a current which divides into first and second currents at node 104 such that a first current is flowing through the first branch formed by transistor 106 and resistor 114 and a second current is flowing through the second branch formed by transistor 108 and resistor 116; The current through the first branch generates at node 110 a potential depending on the voltage applied to the control terminal of transistor 106, i.e. the state of transistor 106, and the value of resistor 114. Similar to the first branch, the potential at the node 112 in the second branch depends on the control voltage applied to transistor 108 and the value of resistor 116.

In this embodiment, the output impedance formed by resistor 114 and 116 and the resistance between the signal terminals of the switch 118 is controllable by a signal applied to the control terminal of switch 118. By varying the resistance of switch 118, the impedance between the node 110 and 112 is varied. Since nodes 110 and 112 are connected to the output of the amplifier, the output impedance of the amplifier is also varied by switch 118. By varying the impedance between the nodes 110 and 112, the gain of the amplifier can be switched by applying an external switching signal to switch 118. By applying the external switching signal, switch 118 can be switched from a first switching state wherein the impedance between nodes 110 and 112 has a high value to a second state wherein the impedance between nodes 110 and 112 has a low value or vice versa.

In particular, if switch 118 is turned off such that no current flows between nodes 110 and 112, the potential at the node 110 is only determined by the ratio of resistor 114 and the variable resistance between the two signal terminals of transistor 106. Similarly, when switch 118 is turned off, the potential at node 112 is only determined by the ratio of the resistances of resistor 116 and the variable resistance between the two signal terminals of transistor 108.

By switching switch 118 to a low resistance value, the potential at nodes 110 and 112 and therefore the gain of the amplifier can be varied. In more detail, the switching of switch 118 to a low resistance value results in an increase of the current between nodes 110 and 112. Thereby, the difference between the potential at node 110 and the potential at node 112 is lowered resulting in a lower gain of the amplifier 100 at the outputs coupled to nodes 110 and 112.

Figure 3:
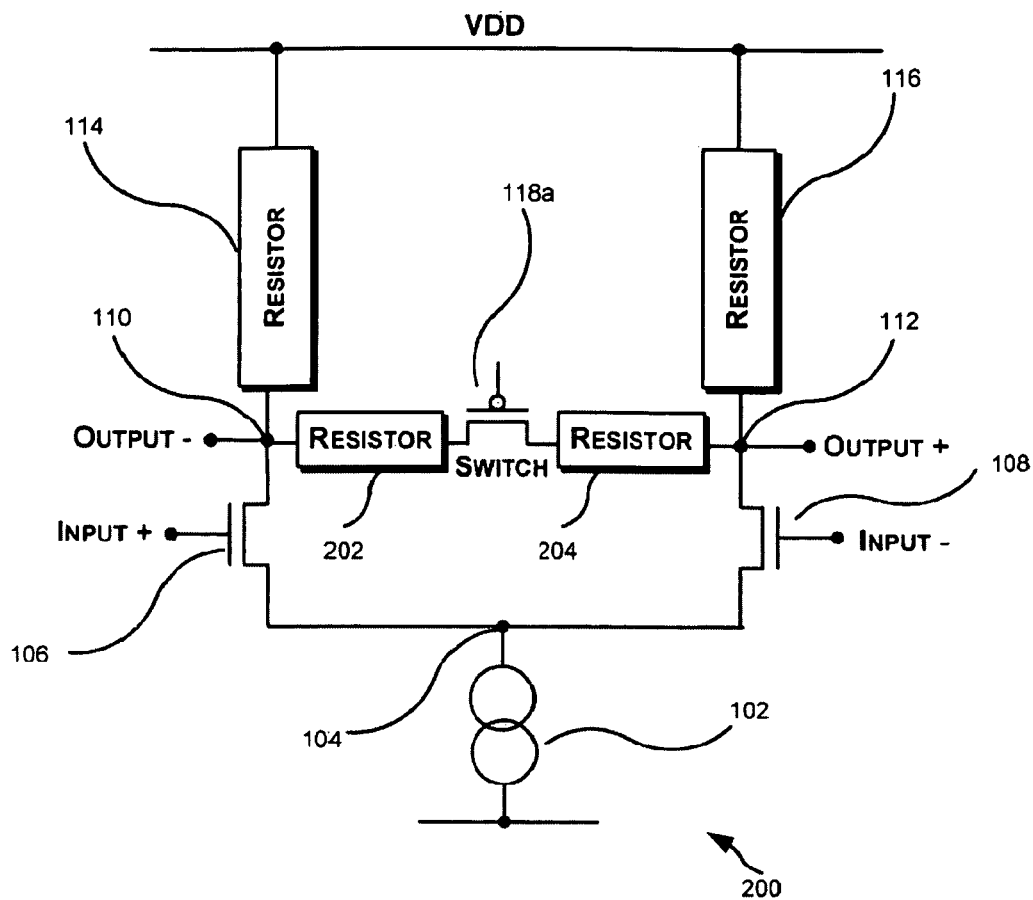
FIG. 3 shows an equivalent circuit of a differential amplifier according to one embodiment to the present invention.

FIG. 3 shows an amplifier 200 which can be used in one embodiment of the present invention as fully-differential amplifier in comparator 16.

In the amplifier 200, like circuit elements are assigned the same reference signs as in the circuit elements of the embodiment shown in FIG. 2. However, as distinguished from the embodiment of FIG. 2, switch 118 for varying the gain of the amplifier 100 is replaced in the amplifier 200 by a switch 118a and two resistors 202 and 204. In particular, resistor 202 is connected between node 110 and a first signal terminal of switch 118a and resistor 204 is connected between the second signal terminal of switch 118a and node 112. Thus, in the amplifier 200, the switch 118a and resistors 202 and 204 connected in series to switch 118a form a first branch parallel to a second branch formed by output impedances 114 and 116 connected via VDD. As can be seen from FIGS. 2 and 3, all other components of amplifier 200 are like to the components of amplifier 100.

The amplifier according to FIG. 3 has the advantage that most of the output voltage drops at the third and fourth resistors 202 and 204 and not between the two terminals of the switch 118a. Compared to the circuit according to FIG. 2, no limitations for switching the switch are encountered in the circuit according to FIG. 3 since the voltage applied to the terminals of the switch 118a is reduced due to the third resistor 202 connected to node 110 and the fourth resistor 204 connected to node 112.

To be more specific, the design of the amplifier according to FIG. 3 allows a fully switching operation for all amplifier outputs without having the risk to drive switch 118a into a non-linear region, resulting in a long recovering time and slowing down the response time of the comparator.

Furthermore, it is a further advantage of the circuit according to FIG. 3 that the parasitic capacitances of the switch 118a are decoupled by resistors 202 and 204 from the outputs of the amplifier. This results in a decrease of the switching time. In addition, due to the decoupling of switch 118a, the influence of the transistor parameters on the performance can be lowered further enhancing the performance of the amplifier according to FIG. 3. In addition, the design of the amplifiers 100 and 200 allows increasing the power supply rejection ratio (PSRR) allowing further improvement of the performance.

The embodiments shown in FIGS. 1 and 2 have the advantage that only one switch, for example only one p-MOS transistor, is required for switching the gain of the amplifier. Thus, parasitic capacitances which are likely to limit the operating bandwidth of the switching of the gain of the amplifier are reduced to a minimum. It is further to be noted that amplifiers 100 and 200 comprise only two active elements, i.e. transistors 106 and 108, besides switch 118 or switch 118a. The embodiments shown in FIGS. 1 and 2 having a minimum of active elements have the advantage that the bandwidth of the amplifier is increased due to the reduced parasitic capacitances as outlined above. However, other embodiments of the present invention encompass more active elements for amplifying and varying the gain of the amplifier.

The switch 118 or the switch 118a for switching the gain of the amplifier is formed in one embodiment as a transistor. In one embodiment, p-MOS transistors are provided for switches 118 or 118a allowing the switching by control signals with voltages lower or equal to the supply voltage VDD.

Furthermore, although amplifiers 100 and 200 are configured as fully-differential amplifiers, it is to be understood that the benefit of the present invention can also be achieved in embodiments of the present invention encompassing single-ended amplifiers used within the comparator 16.

It is a particular advantage of the amplifiers 100 and 200 having the switches 118 and 118a parallel to the output impedances 114 and 116 that the bandwidth of the amplifier and the gain of the amplifier are varied complementary to each other. That is, the bandwidth of the amplifier is increased when the gain of the amplifier is decreased and the bandwidth of the amplifier is decreased when the gain of the amplifier is increased. In one embodiment, the amplifiers 100 and 200 are configured such that the product of the gain and bandwidth is kept approximately constant. This is advantageous for many applications such as in an analog-to-digital converter of the successive approximation type as set forth below.

The amplifiers described in the above embodiments are particularly suited for applications in a comparator for comparing voltages in converters such as an analog-to-digital converter of the successive approximation type as set forth below.

In particular, the present invention achieves an optimum for the gain and bandwidth of the amplifier which, allows the optimization of the time budget for cycles in an analog-to-digital conversion such as an analog-to-digital conversion of the successive approximation type. As described in more detail below, the amplifier is also well suited as amplifying stages in a multi-stage amplifier comprising an array of multiple amplifying stages.

According to the embodiments of FIGS. 2 and 3, a parasitic capacitance is reduced resulting in a further decrease of the switching time. According to FIGS. 2 and 3 the output impedance can be switched without varying the common mode potential at the nodes 110 and 112.

Amplifier 100 and amplifier 200 act truly differential but only require a single switch for switching the output impedance between the outputs of the amplifier. In other embodiments of the present invention, a plurality of switches for switching the output impedance of the variable gain amplifier are provided as will be described below with respect to FIG. 4.

Figure 4:
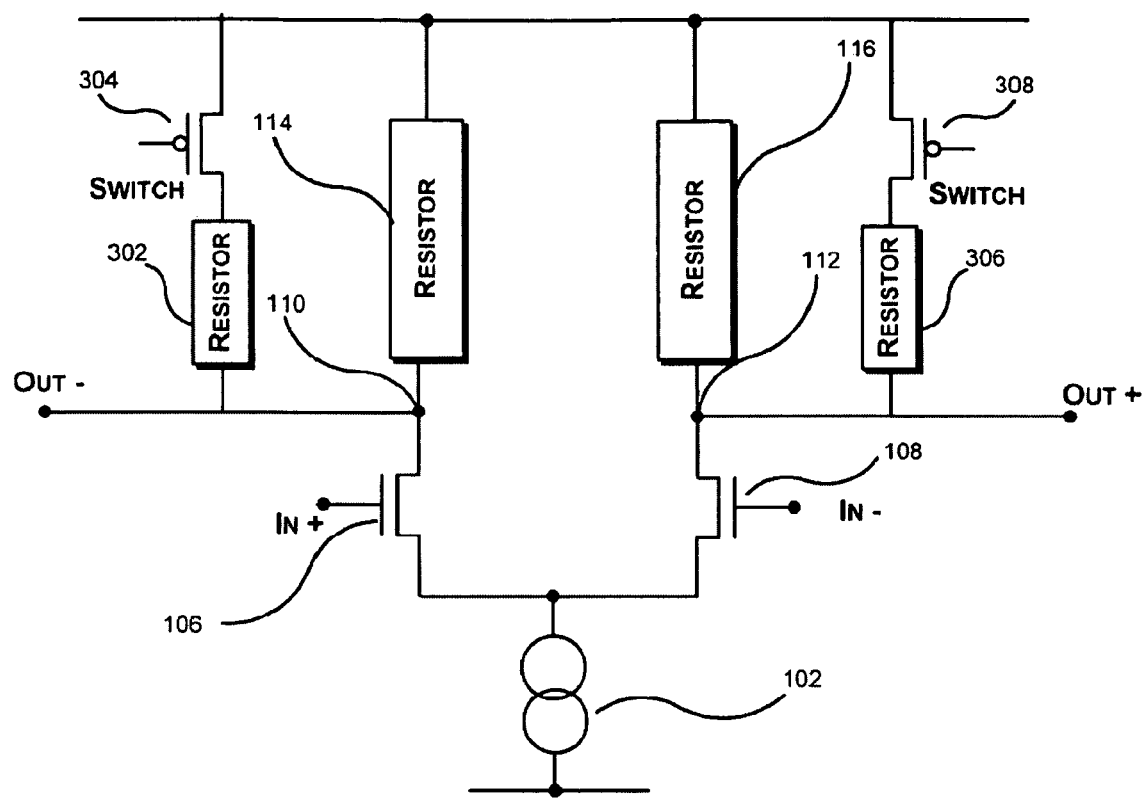
FIG. 4 shows an equivalent circuit of a differential amplifier according to a further embodiment of the present invention.

FIG. 4 shows an embodiment of an amplifier 300 wherein as distinguished from the amplifiers shown in FIGS. 2 and 3 a resistor 302 and a switch 304 are provided in a first branch parallel to resistor 114 and a resistor 306 and a switch 308 are provided in a second branch parallel to resistor 116.

Figure 5:
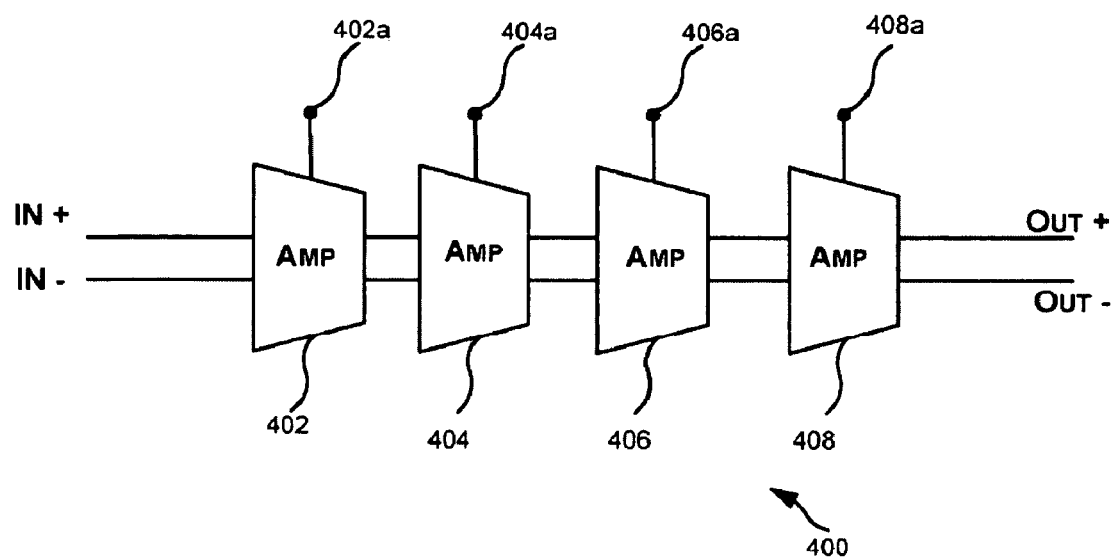
FIG. 5 shows a serial connection of a plurality of amplifying stages according to an embodiment of the present invention.

Referring now to FIG. 5, a further embodiment of the present invention is described wherein the amplifier of comparator 16 comprises a cascade of switchable amplifying stages.

FIG. 5 shows a series arrangement of four amplifying stages 402, 404, 406 and 408. The four amplifying stages 402 to 408 form a multi-stage-amplifier 400 wherein each of the amplifying stages 402 to 408 are configured to have a switchable gain as described with respect to FIGS. 1 to 4. In other words, in one embodiment of the present invention, each of the amplifying stages 402 to 408 is configured according to one of the amplifying circuits shown in FIGS. 2 to 4.

FIG. 5 shows a plurality of four amplifying stages. However, the number of amplifying stages can be varied in other embodiments according to requirements of the multi-stage-amplifier 400 or other design parameter. Moreover, switchable and non-switchable amplifying stages can be combined in other embodiments. Thus, one or more of the amplifying stages can be replaced by non-switchable amplifiers while the benefit of the present invention still can be achieved.

In the multi-stage-amplifier 400, each of the amplifying stages 402 to 408 comprises a control input 402a, 404a, 406a and 408a, respectively. As described above, the gain of each of the amplifying stages can be switched allowing a high dynamical range of the multi-stage-amplifier.

Each of the amplifying stages can be provided as similar circuits. However, in other embodiments, the amplifying stages 402 to 408 are provided as non-identical circuits. For example, each of the amplifying stages can have a different range of gains which can be switched by applying the control signals to the control inputs. The range of gain can be varied for example by providing different values of the resistors 114 and 116 in each of the amplifying stages. In one embodiment, the value of the resistors 114 and 118 is increased successively for each stage starting at a value of 300 Ω for the first amplifying stage to a value of 3 kΩ for the fourth amplifying stage 408. According to one embodiment, the gain of at least one of the amplifying stages is switched such that each gain of the at least one amplifying stage is within a range between 1.5 and 4.

The multi-stage-amplifier according to FIG. 5 allows obtaining an optimum of amplifying gain and amplifying bandwidth suitable to increase the bandwidth of the multi-stage amplifier for many applications.

The total gain of the multi-stage-amplifier is determined by multiplying the gains of each of the amplifying stages. Depending on the technology and operating voltage using the illustrated embodiments of the present invention, an optimum for the amplification of the stages and scaling of the stages can be achieved by considering the limitations of PSRR, noise of the amplifier and consumption of power and chip area of the total circuit in view of the amplifying gain and amplifying bandwidth.

The above described amplifiers allow a high dynamical range combined with the possibility to achieve a high amplifying gain to amplify small signals with high accuracy. In conventional amplifiers used within comparators, the amplifier or amplifying stages are overdriven when signals of high amplitude are applied. However, overdriving the amplifier or amplifying stages has the drawback that the output of the amplifier reacts with a maximum delay when a small signal of reversed polarity is applied after overdriving the amplifier. This limits the usable bandwidth with a conventional amplifier. With the above described amplifiers, a dynamical adaptation of the output impedance allows to increase the bandwidth of the amplifier or amplifying stage by switching amplifier to a low gain.

By providing the gain of the amplifier selectable switchable, the embodiments of present invention allow a dynamical adaptation of the output impedance by applying a switching signal to the variable-gain amplifier or to one of the variable-gain amplifying stages. With this concept, it is not only possible to provide a more flexible amplification but the bandwidth of the amplifying stage can also be increased by lowering the amplifying gain, a dynamic adaptation which allows a decrease in the time for comparing the analog signal applied to input terminal 26 with the signal applied to the variable-gain amplifier by digital-to-analog converter 14 as set forth below.

Figure 6:
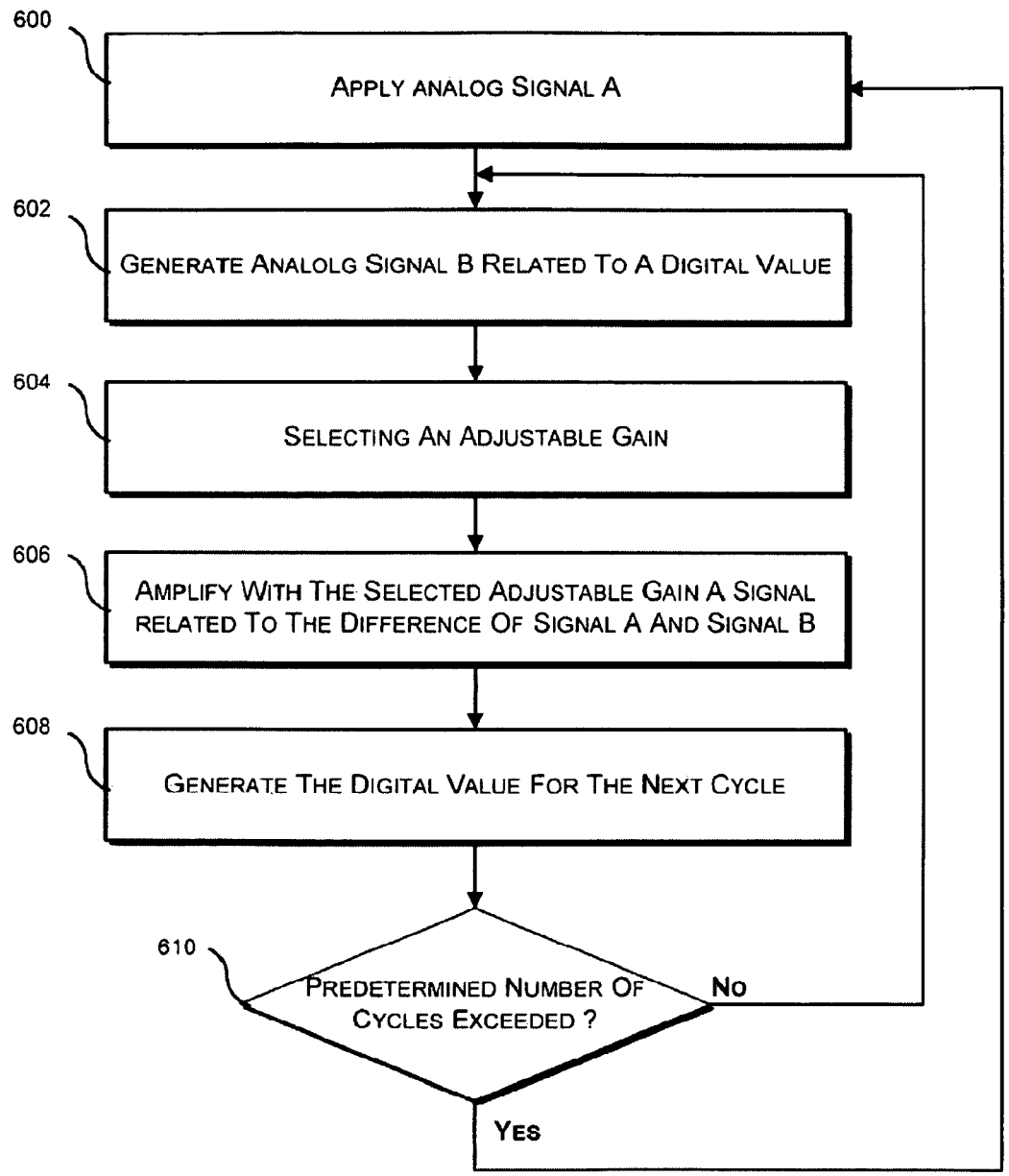
FIG. 6 shows a flow diagram of a method for converting an analog signal according to an embodiment of the present invention

After having explained in detail the design of converters according to embodiments of the present invention, reference is now made to FIG. 6 showing a flow chart for describing an analog-to-digital conversion according to one embodiment of the present invention.

In a first step 600, an analog signal A which is to be converted into a digital signal, is applied to an input terminal of an analog-to-digital converter. In step 602, an analog signal B is generated related to a digital value. The digital value is one of a plurality of predetermined digital values, selected for each cycle of the successive approximation dependant on the outcome of the comparison of the analog signal and the signal applied by step 602 in the previous cycle.

In a step 604, an adjustable gain is selected. Controlling of the gain is performed, such that at least two different gains for cycles of the successive approximation are selected. In one embodiment, the gain is selected based on the number of the cycle or the number of the bit determined in the respective cycle.

In a step 606 a signal related to the difference of Signals A and B is amplified with the selected adjustable gain.

In a step 608, a digital value is generated which is used in step 602 of the next cycle to generate analog signal B. The signal provided in step 606 is a signal identifying whether signal A is lower or higher than signal B. Thus, depending on this information, the digital value for the next cycle is generated based on the information of the relation of Signals A and B in order to successively approximate the applied signal A.

It is to be noted here that any known successive approximation can be used for converting the analog Signal A into a digital signal. Thus, embodiments of the present invention cover binary as well as a non-binary successive approximation.

In step 610 it is determined whether a predetermined number of cycles related to the number of bits of the converted digital signal is exceeded. If the predetermined number of cycles is not exceeded, steps 602 to 608 are repeated until the successive approximation has determined all bits. Then, a new signal A is applied and the above steps are repeated for a new successive approximation.

It is to be noted that the above sequence can be interchanged. That is, other embodiments encompass several modifications of the above sequence wherein, for example, steps 602 and 604 are exchanged, i.e. the gain can be selected prior to generate the analog signal B.

It is a significant advantage of the described embodiment that the gain of the amplifier is dynamically adapted such that the gain can be reduced for the cycles at the beginning of the successive approximation. At the beginning of the successive approximation, i.e. the very first cycles of the approximation, the signal related to the difference between signals A and B is high and therefore would need a longer settling time as smaller signals uncounted at the end of the successive approximation. By reducing the gain of the amplifier, the bandwidth of the amplifier can be increased and therefore the time for comparing the signals A and B can be decreased since the amplifier needs a smaller time interval for a low gain compared to the time interval for a high gain.

Figure 7A:
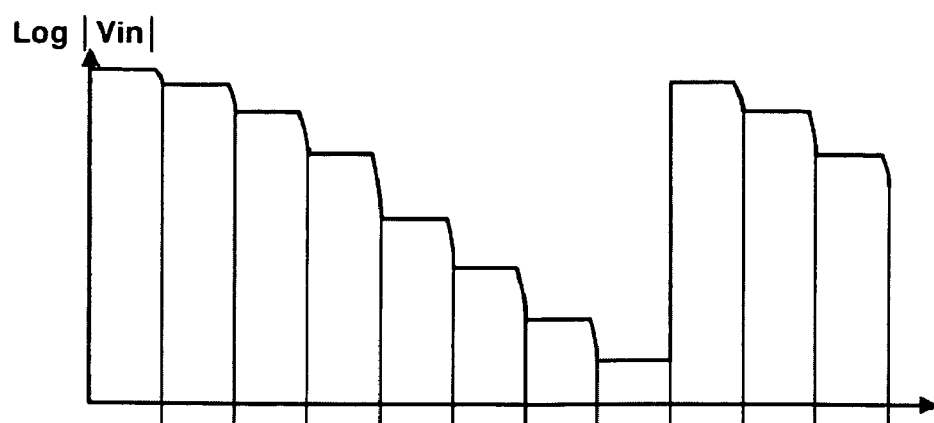
FIG. 7 shows a switching timing chart according to an embodiment of the present invention.
Figure 7B:
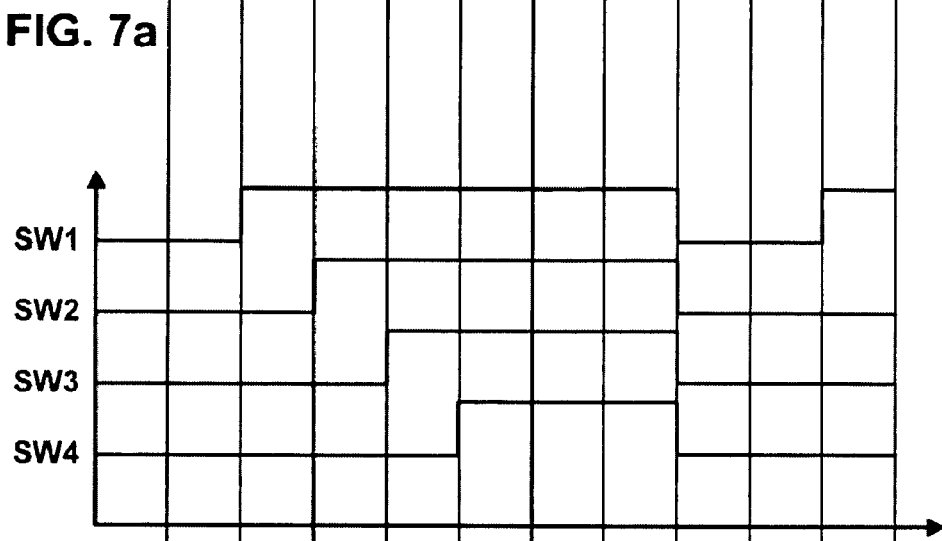
Figure 7:
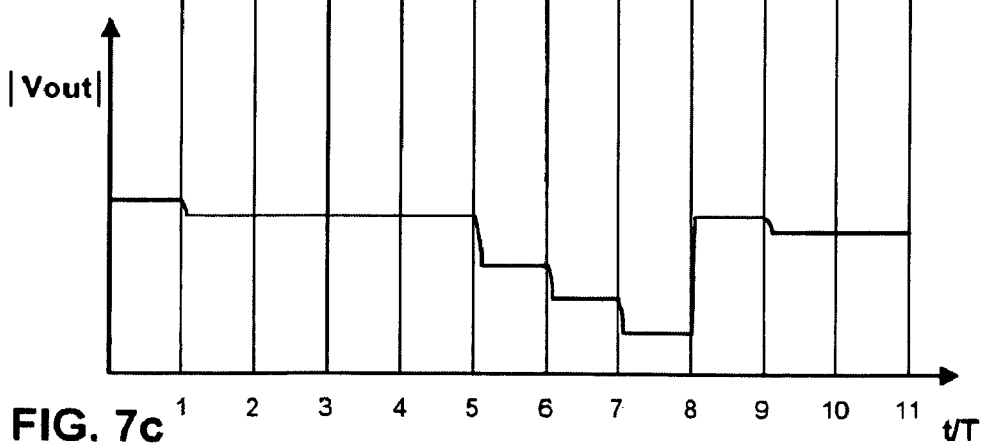
Figure 8:
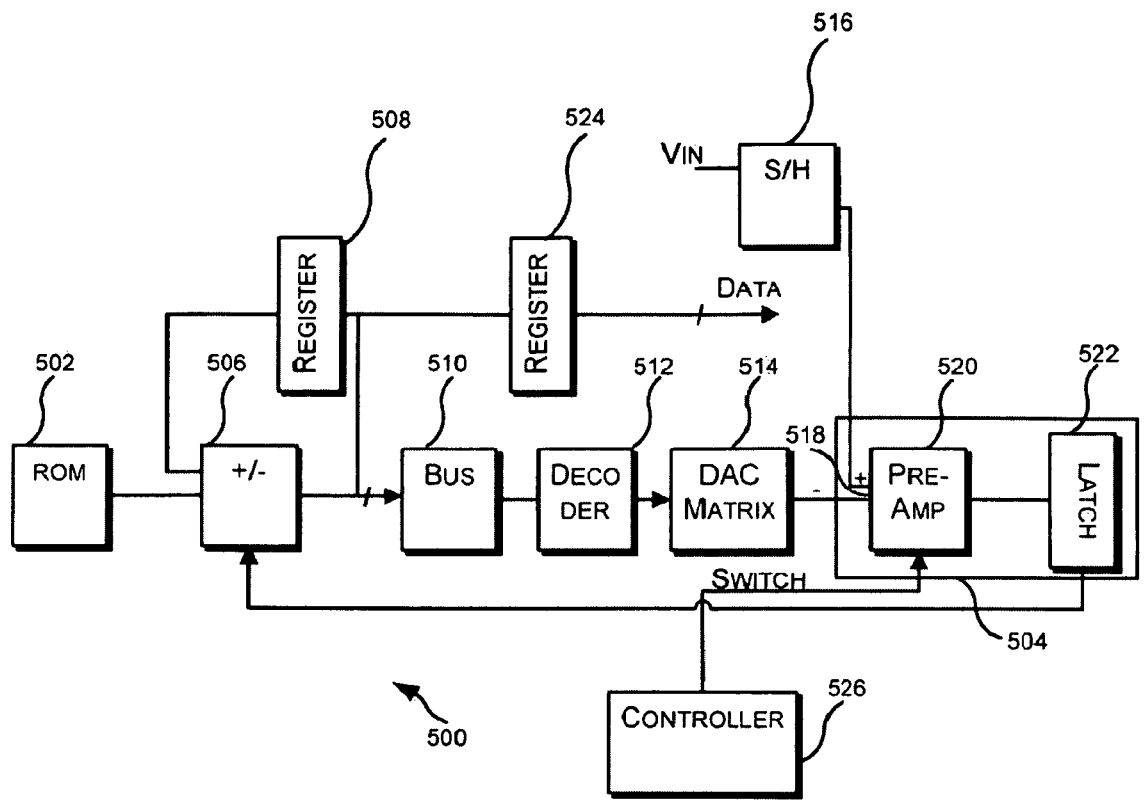
FIG. 8 shows an equivalent circuit of an analog-to-digital converter according to one embodiment of the present invention.

FIG. 7 shows a timing diagram illustrating the switching of the gain of preamplifier 520 shown in FIG. 8, according to one embodiment. The timing diagram in FIG. 7 is described with the comparator comprising a multi-stage-amplifier having four stages as described with respect to FIG. 5. However, the scheme can equally applied to a one-stage amplifier as described in FIGS. 2 to 4.

The upper diagram 7a of FIG. 7 shows the input of the variable-gain amplifier for a series of cycles vs. time. In the first cycle of the successive approximation, a high voltage is applied to the variable-gain amplifier since the first cycle of successive approximation is in general a course approximation resulting in a high difference of signals A and B. For each cycle, the voltage input of the variable-gain amplifier is lowered since the approximation gets significantly better with each cycle. After eight cycles, i.e. after the last bit of the digital value has been determined, the cycling scheme is repeated.

FIG. 7b shows a timing diagram for the switching control signals of each of the amplifying stages of the multi-stage-amplifier shown in FIG. 5. For the first two cycles, the amplifying stages 402 to 408 are all turned off such that each amplifying stage is at a low gain. Thus, the multi-stage-amplifier amplifies the high input signals of the first and second cycle with only a low gain which is sufficient for a correct storage of the output signal in latch 522. After the end of the second cycle, a switching signal is applied to the first amplifying stage 402 in order to switch from a low gain to a high gain. The amplifying gains of the other amplifying stages are kept at the low gain. After the end of the third cycle, a switching signal is applied to the second amplifying stage 404 in order to switch from a low gain to a high gain. After the fourth cycle, a switching signal is applied to the third amplifying stage 406 for switching from a low gain to a high gain. After the fifth cycle, a switching signal is applied to the fourth amplifying stage 408 for switching same from a low gain to a high gain. The high gain value obtained after switching the fourth amplifying stage is kept until the approximation cycle is repeated after 8 cycles.

Thus, the multi-stage amplifier is operated to switch the amplifying stages 402 to 408 successively from a low gain to a high gain. It is to be recognized that other predetermined schemes for switching the amplifying stages can be applied in order to achieve the benefits of the present invention. For example, although it is described to switch the first amplifying stage at the end of the second cycle, it can be switched in one embodiment at the end of the first cycle. In general, every possible switching scheme can be used for switching the amplifying stages.

At the beginning of the successive approximation, the signal is very high and therefore needs a longer settling time compared to the smaller signals encountered in the last cycles of the successive approximation. By reducing the gain of the amplifier 520, the bandwidths of the amplifier can be increased since the amplifier needs a smaller time interval for a low gain compared to the time interval for a high gain. For example, as shown in FIG. 7 each cycle only requires a time interval of two ns. These small time intervals are mainly due to the increase of the bandwidth of preamplifier 520 which helps to decrease the time required for comparing high voltages in the beginning of a successive approximation.

FIG. 7c shows the output of the amplifier for the switching timing as shown in FIG. 7b. It is to be noted that FIG. 7c shows the output voltage on a linear scale whereas FIG. 7a shows the input voltage on a logarithmic scale. As can be seen, by increasing the gain from a low value to high value, the range of the output voltage can be significantly reduced compared to the range of the input voltage. The reduction of the range of the output signals also has the advantage that the variation of the output signal fed back to generate the digital value for the next cycle is reduced resulting in an output signal having a lower range. Therefore, elements such as filters or latches provided in the feed-back loop can be better configured for the smaller voltage range of the signal achieved with the adaptation of the gain of the variable-gain amplifier.

Although FIG. 5 shows a successive approximation with no pre-processing, other embodiments of present invention are implemented in a pipelined approximation wherein data are preprocessed in order to speed up the cycle time which is described below with respect to FIG. 8.

As a further embodiment of the present invention, FIG. 8 shows an analog-to-digital converter 500 of the successive approximation type comprising a ROM containing data for selecting the digital value input to the digital-to-analog converter for applying a signal to a first input of a comparator 504. The ROM 502 is connected to a computing unit 506 for adding or subtracting a value stored in a register 508 dependent on the outcome of the comparator 504. The computed digital value is applied to a bus 510 connected to a decoder 512. Decoder 512 is connected to a DAC matrix (digital-to-analog conversion matrix) 514 for converting the digital signal into an analog signal applied to a first inverting input of comparator 504. A second input of comparator 504 is connected to a sample/hold unit to which the analog signal to be converted into a digital value is applied. The inputs of converter 504 are connected to a differential input 518 of preamplifier 520 having a switchable gain as described with respect to the previous embodiments. Preamplifier 520 has a control input coupled to a controller 526 for applying a switching signal for switching the gain of the preamplifier. The controller 526 can generate the control signal for dynamically adapting the amplifier depending on the bit-value corresponding to each cycle of the successive approximation, as described above. The output of the preamplifier 520 is connected to a latch 522 which is connected to an output of the comparator 504.

In operation, cycles are repeated to determine each bit of a digital number representing the analog signal applied to the analog-to-digital converter. A predetermined digital value is read from register 508 and applied to digital computing unit 506.

As described above, for each bit to be determined, the digital value is read from the register 508 and applied to the computing unit 506 for successively approximating the analog signal. The new calculated digital value is stored in the register 508 and also in output register 524. The calculated new value is transmitted over bus 510 to decoder 512 and DAC matrix 514 for converting the digital value into an analog signal. The converted analog signal is applied to the inverting input of the comparator 504. In one embodiment, the result of the computation performed by computing unit 506 can be preprocessed in order to speed up the time required to perform one cycle of the successive approximation process.

The analog signal to be converted by the analog-to-digital converter is applied to the non-inverting input of comparator 504 connected to sample/hold unit 516. The signals are supplied to differential input 518 for comparing the inverted signal applied by DAC matrix 514 and the non-inverted signal applied by sample/hold unit 516. Preamplifier 520 provides an amplified signal with a gain determined by the control signal applied by controller 526. The amplified signal is applied to latch 522 requiring for proper operation a value of the signal higher then a de-determined minimum value, for example a few mV. By selectively adjusting the gain, the successive approximation conversion can be operated such that a low gain can be selected for the first cycles of the approximation, which are determining the most significant bit and the first few bit numbers following the most significant bit, the analog signal applied by DAC matrix 514. The better the approximation gets with each cycle, the more gain is required for amplifying the signals in preamplifier 520 in order to provide proper output to latch 522. By providing preamplifier 520 as a variable gain amplifier according to the embodiments described herein, the gain of the preamplifier 520 is be dynamically adjusted starting from a low gain for cycles corresponding to higher order bits to a high gain for cycles corresponding to lower order bits.

Although preamplifier 520 is described in the above embodiment as a multi-stage amplifier, it is to be recognized that preamplifier can be a single amplifying unit. With a single unit, switching to different multiple gain values can be achieved by applying multi-level-signals having n levels to the gain control input of the preamplifier, wherein a first level of the signal corresponds to a first gain, a second level of the signal corresponds to a second value of the gain, a third level of the signal corresponds to a third of the gain and a nth level of the signal corresponds to a nth value of the gain.

In one embodiment of the invention, the variable-amplifier is a single-ended amplifier. In this embodiment, a summing node connected to the input of the amplifier can be used for combining the unknown analog signal and the signals from the digital-to-analog converter. The unknown signal or the signals from the digital-to-analog converter can be inverted before applying same to the summing node.

It will be understood by the person skilled in the art that in other embodiments the signals transmitted between two units or blocks shown in the described embodiments can be modified, for example by filters, amplifiers or other modifying elements. It is therefore intended, to include also any circuits for providing such modifications of the signals.

Although it is described in the above embodiments to apply a switching signal to the comparator for switching the gain of the amplifier, it is to be noted that according to one embodiment the switching of the gain can be controlled within the comparator. For example, a counter can be provided within the comparator to count the number of cycle and the variable-gain amplifier can be controlled by the counter. In this embodiment, switching of the variable gain amplifier is effected dependent on the output signal of the counter related to the number of the respective cycle. For example the gain amplifier can be switched stepwise to a higher gain for each second cycle of the successive approximation and reset to the starting gain, if the counter reaches the predetermined maximum cycle number for each successive approximation.

What is claimed is:

1. A converter comprising:
   an input terminal receiving a first analog signal; a digital-to-analog converter to provide second analog signals related to digital values applied to the digital-to-analog converter;
   a comparator, receiving the first and second analog signals, the comparator comprising a variable-gain amplifier to provide an output signal based on a difference between the first and second analog signals;

a state machine receiving the output signal of the comparator and generating the digital values applied to the digital-to-analog converter based on the output signal of the comparator; and a controller for selectively setting the gain of the variable-gain amplifier, wherein the variable-gain amplifier comprises a switch connected between a first and second output of the variable-gain amplifier.

2. The converter according to claim 1, wherein the switch comprises a transistor.

3. The converter according to claim 2, wherein the transistor comprises a first and second terminal, and at least one of the first and second terminals of the first transistor is connected via a first resistor to at least one of the first and second output of the variable-gain amplifier.

4. The converter according to claim 3, wherein the first terminal receives the first output via the first resistor and the second terminal receives the second output via a second resistor.

5. The converter according to claim 4, wherein the variable-gain amplifier further comprises a third and fourth resistor, wherein the third resistor is connected between a first node and a power supply rail, and the fourth resistor is connected between a second node and the power supply rail, wherein the first terminal of the transistor is connected via the first resistor to the first node and wherein the second terminal of the transistor is connected via the second resistor to the second node.

6. The converter according to claim 5, wherein the amplifier further comprises a second transistor connected between the first node and a terminal of a current source and a third transistor connected between the second node and a terminal of the current source.

7. The converter according to claim 2, wherein the transistor is a p-MOS transistor.

8. The converter according to claim 1, wherein the variable-gain amplifier is a differential amplifier.

9. The converter according to claim 1, wherein the converter is a pipelined successive approximation analog-to-digital converter.

10. A converter comprising:
an input terminal receiving a first analog signal; a digital-to-analog converter to provide second analog signals related to digital values applied to the digital-to-analog converter;
a comparator, receiving the first and second analog signals, the comparator comprising a variable-gain amplifier to provide an output signal based on a difference between the first and second analog signals;
a state machine receiving the output signal of the comparator and generating the digital values applied to the digital-to-analog converter based on the output signal of the comparator; and
a controller for selectively setting the gain of the variable-gain amplifier, wherein the comparator comprises a latch coupled between an output of the variable gain amplifier and an output of the comparator.

11. A method for converting an analog input signal into a digital signal by successive approximation conversion comprising:
for each cycle of the successive approximation, amplifying, with a selectively adjustable gain, a signal related to a difference between a first analog signal related to the analog input signal and a second analog signal related to a digital value predetermined for each cycle to provide an amplified difference signal;
generating the predetermined digital value of the next cycle based on the amplified difference signal;

controlling the selectively adjustable gain, such that the selectively adjustable gain is different for at least two successive cycles; and
wherein each cycle of the successive approximation conversion is associated with a respective bit level to be determined and wherein the selectively adjustable gain is determined by the number of each cycle.

12. The method according to claim 11, wherein the selectively adjustable gain is stepwise increased from a first gain to a second gain.

13. The method according to claim 12, wherein the stepwise increase of the gain from the first gain to the second gain is repeated when the last cycle of the successive approximation is completed.

14. The method according to claim 13, wherein the second gain is higher than the first gain and wherein the amplifying bandwidth of the second gain is lower than the amplifying bandwidth of the first gain.

15. The method according to claim 11, wherein the gain is selectively adjusted by switching a gain of at least one of a plurality of amplifying stages.

16. The method according to claim 15, wherein the gain of the at least one amplifying stage is switched such that each gain is within a range between 1.5 and 4.

17. The method according to claim 15, wherein the gain is selectively adjusted by switching a transistor connected between a first and second output of the at least one amplifying stage.

18. The method according to claim 17, wherein the transistor comprises a first and second terminal and at least one of the first and second terminal of the first transistor is connected via a first resistor to at least one of the first and second output of the at least one amplifying stage.

19. A comparator for comparing an unknown first analog signal and second signals applied to the comparator based on digital values, the comparator comprising:
a first input for receiving the unknown first analog signal;
a second input for receiving the second signals;
an amplifier for providing an output signal based on a difference between the first and second signals, the amplifier having an input for receiving a switching signal and being adapted to selectively switch from a first gain to a second gain based on the switching signal;
a latching circuit to latch the output signal of the amplifier and to provide a comparator signal based on the output signal of the amplifier.

20. The comparator according to claim 19, wherein the amplifier comprises a first and second output and a transistor coupled between the first and second output for switching from a first to a second gain.

21. The comparator according to claim 20, wherein the transistor comprises a first and second terminal and at least one of the first and second terminals is connected via a resistor to at least one of the first and second outputs of the amplifier.

22. The comparator according to claim 21, wherein the first terminal is connected to a first node via a first resistor and the second terminal is connected to a second node via a second resistor, wherein a second transistor is connected between the first node and a terminal of a current source and a third transistor is connected between the second node and the terminal of the current source, wherein a control terminal of the second transistor is connected to a first input of the variable-gain amplifier and a control terminal of the third transistor is connected to a second input of the variable-gain amplifier.

* * * * *